United States Patent
Chen et al.

(10) Patent No.: US 7,889,490 B2
(45) Date of Patent: Feb. 15, 2011

(54) SERVER WITH TRAYS FOR ELECTRONIC COMPONENTS

(75) Inventors: Shyn-Ren Chen, Taipei (TW); Tsai-Kuei Cheng, Taipei (TW); Shi-Feng Wang, Shanghai (CN); Ji-Peng Xu, Shanghai (CN); Yong-Hua Chen, Shanghai (CN); Li-Hong Huang, Shanghai (CN); Ting Song, Shanghai (CN); Chia-Nan Chien, Taipei (TW); Banks Chen, Taipei (TW)

(73) Assignee: Inventec Corporation, Taipei (TW)

( * ) Notice: Subject to any disclaimer, the term of this patent is extended or adjusted under 35 U.S.C. 154(b) by 30 days.

(21) Appl. No.: 12/545,273

(22) Filed: Aug. 21, 2009

(65) Prior Publication Data
US 2010/0265650 A1    Oct. 21, 2010

(30) Foreign Application Priority Data
Apr. 17, 2009    (TW) .............................. 98112808 A

(51) Int. Cl.
G06F 1/16    (2006.01)
(52) U.S. Cl. .................... 361/679.33; 439/74; 455/566; 360/245.1
(58) Field of Classification Search ................. 455/566, 455/550.1, 90.1; 439/74, 541.5; 312/223.2, 312/223.3; 235/441, 492; 353/15, 122; 360/245.1, 360/97.01, 97.02, 94; 361/679.08, 679.13, 361/679.14, 679.55, 679.4, 679.58, 679.32, 361/679.31, 679.48
See application file for complete search history.

(56) References Cited

U.S. PATENT DOCUMENTS

| | | | | |
|---|---|---|---|---|
| 6,567,271 B2 * | 5/2003 | Stone et al. | .................. | 361/724 |
| 2008/0293265 A1 * | 11/2008 | Nguyen et al. | ................. | 439/74 |
| 2010/0265645 A1 * | 10/2010 | Wang et al. | .............. | 361/679.4 |

* cited by examiner

Primary Examiner—Hung V Duong
(74) Attorney, Agent, or Firm—J.C. Patents

(57) ABSTRACT

A sever including a chassis, at least one first tray, at least one second tray, a power supply module, multiple input/output interface circuit boards, and multiple mother boards is provided. The first and second trays are slidably disposed in the chassis, and the first and second trays can be drawn out of the chassis in opposite directions. The power supply module is disposed on a bottom plate of the chassis. The input/output interface circuit boards are disposed on the first tray, respectively. The power supply module is located between two input/output interface circuit boards. Each input/output interface circuit board has multiple input/output interfaces. The mother boards are disposed on the second trays, respectively. The input/output interface circuit boards and the power supply module are correspondingly electrically connected to the mother boards.

14 Claims, 5 Drawing Sheets

SERVER WITH TRAYS FOR ELECTRONIC COMPONENTS

CROSS-REFERENCE TO RELATED APPLICATION

This application claims the priority benefit of Taiwan application serial no. 98112808, filed on Apr. 17, 2009. The entirety of the above-mentioned patent application is hereby incorporated by reference herein and made a part of this specification.

BACKGROUND OF THE INVENTION

1. Field of the Invention

The present invention relates to a server, and more particularly, to a server having a new architecture.

2. Description of Related Art

Servers are currently widely used by various enterprises. Applications of the servers can include internet network and telecommunication industries as well as ordinary people's daily lives. For example, in financial and economic, online bank and online credit card fields, the powerful computing power of the server is required for obtaining a sufficient high level of security of data to prevent data crack. The server is intended to provide various types of processed information in a local network, internet network or another type of network such that other client terminals connected to the server via the network can quickly obtain needed data or results and output the needed data or results to objects that need them.

FIG. 1 illustrates system architecture of a conventional server. Referring to FIG. 1, the conventional server 100 includes a mother board 110, a hard disk drive tray 120, a plurality of fans 130, and a plurality of connectors 140. A plurality of hard disk drives (not shown) is disposed in the hard disk drive tray 120. The connectors 140 are disposed on the mother board 110. The connectors 140 can be a power control connector, a SATA connector, an IDE connector, a floppy disk drive connector, and a universal serial bus (USB) connector. The fans 130 are used to dissipate heat of the conventional server 100.

SUMMARY OF THE INVENTION

Accordingly, the present invention is directed to a server with a new architecture.

The present invention provides a server including a chassis, at least a first tray, at least a second tray, a power supply module, a plurality of input/output interface circuit boards, and a plurality of mother boards. The first tray and the second tray are both slidingly disposed in the chassis such that the first tray and the second tray are capable of being drawn out of the chassis in opposite directions, respectively. The power supply module is disposed on a bottom plate of the chassis. The input/output interface circuit boards are disposed on the first trays, respectively. Each of the input/output interface circuit boards comprises a plurality of input/output interfaces. The mother boards are disposed on the second trays, respectively. The input/output interface circuit boards and the power supply module are electrically connected to the mother boards correspondingly.

According to one embodiment of the server, the power supply module comprises a power supply and a power supply backplane. The power supply is fixed on the bottom plate of the chassis and disposed between two of the input/output interface circuit boards. The power supply backplane is disposed in the chassis and between the mother boards and the input/output interface circuit boards. The power supply backplane is electrically connected with the mother boards. In addition, the power supply backplane divides the chassis into a first region in which the first trays are disposed and a second region in which the second trays are disposed.

According to one embodiment of the server, the mother boards comprise a plurality of connectors thereon, and the power supply module is connected to the mother boards through the connectors such that the power supply module provides power to the mother boards.

According to one embodiment of the server, the input/output interface circuit boards comprise a plurality of connectors thereon, and the connectors on the mother boards are coupled to the connectors on the input/output interface circuit boards such that the mother boards transmit signals to the input/output interface circuit boards.

According to one embodiment of the server, the server further comprises a hard disk drive bracket, a plurality of hard disk drives, and a hard disk drive backplane. The hard disk drive bracket is disposed on the mother board. The mother board has a slot. The hard disk drive bracket comprises a plurality of fixing portions disposed on a side of the hard disk drive bracket adjacent the slot. The hard disk drives are disposed in the hard disk drive bracket. The hard disk drive backplane comprises a first connecting portion, a plurality of second connecting portions, and a plurality of mounting portions. The first connecting portion is a gold finger interface connected into the slot. Each of the second connecting portions is connected to a corresponding one of the hard disk drives. The mounting portions are mounted to the fixing portions to fix the hard disk drive backplane to one side of the hard disk drive bracket.

According to one embodiment of the server, the server further comprises at least one fan unit disposed on the first tray. The input/output interface circuit which disposed on the first tray has an opening according to the position for the fan unit, and the first tray comprises a plurality of opposing supporting portions. Each of the supporting portions has a plurality of latching slots. Each of the fan units comprises a fan bracket and a plurality of fan vibration resisting elements connected to the fan bracket. The fan vibration resisting elements are fixed to a bottom side wall of the fan bracket and are correspondingly latched in the latching slots, respectively, such that each of the fan brackets suspends and is fixed between any two of the opposing supporting portions.

According to one embodiment of the server, the input/output interface is a universal serial bus interface, a peripheral component interconnection express card or a network adapter.

According to one embodiment of the server, the server further comprises a plurality of snap-fit structures adapted to be disposed on a surface of the first tray and the second tray. Each of the snap-fit structures is disposed at a side of one of the first tray and the second tray away from each other. The chassis comprises a positioning portion. The snap-fit structure comprises a handgrip, a spring element, and a locking element. The handgrip is pivoted to the surface of the first tray or the second tray. The spring element is connected to and fixed at the first tray or the second tray and urged against the handgrip. The locking element is fixed to the first tray or the second tray such that the handgrip is in an initial position when the locking element is locked with the handgrip. When the locking element does not interfere with the handgrip, the elasticity of the spring element is exerted on the handgrip to move the handgrip away from its initial position. The handgrip leaving its initial position urges the spring element such that the locking element is locked with the handgrip, the handgrip is positioned in its initial position. Specifically, the handgrip comprises a rotary axle and a positioning element. The handgrip has a first end and a second end opposite to the first end. The rotary axle is disposed at the first end and adapted to be connected to the first tray or the second tray such that the handgrip is adapted to rotate on the surface. The positioning element is disposed on the first end and adapted to interfere with the positioning portion such that the first tray or the second tray is fixed to the chassis. The spring element comprises a first fixing portion adapted to be fixed to the first tray or the second tray, and an urging portion connected to the first fixing portion and urging the handgrip. The locking element comprises a second fixing portion adapted to be fixed to the first tray or the second tray, and a locking portion connected to the second fixing portion and locked to the second end.

According to one embodiment of the server, the server further comprises a plurality of central partition plates adapted to isolate the mother boards or the input/output interface circuit boards from each other. Each of the central partition plates comprises a plurality of rails through which the first trays and the second trays are slidingly disposed in the chassis.

According to one embodiment of the server, the side of the first tray away from the second tray comprises a first bending portion, the side of the second tray away from the first tray comprises a second bending portion, and the first bending portion and the second bending portion form a rear window and a front window of the chassis, respectively.

In view of the foregoing, locations of the elements within the server are re-arranged to meet the customizing needs.

In order to make the aforementioned and other features and advantages of the present invention more comprehensible, embodiments accompanied with figures are described in detail below.

DESCRIPTION OF THE EMBODIMENTS

Figure 1:
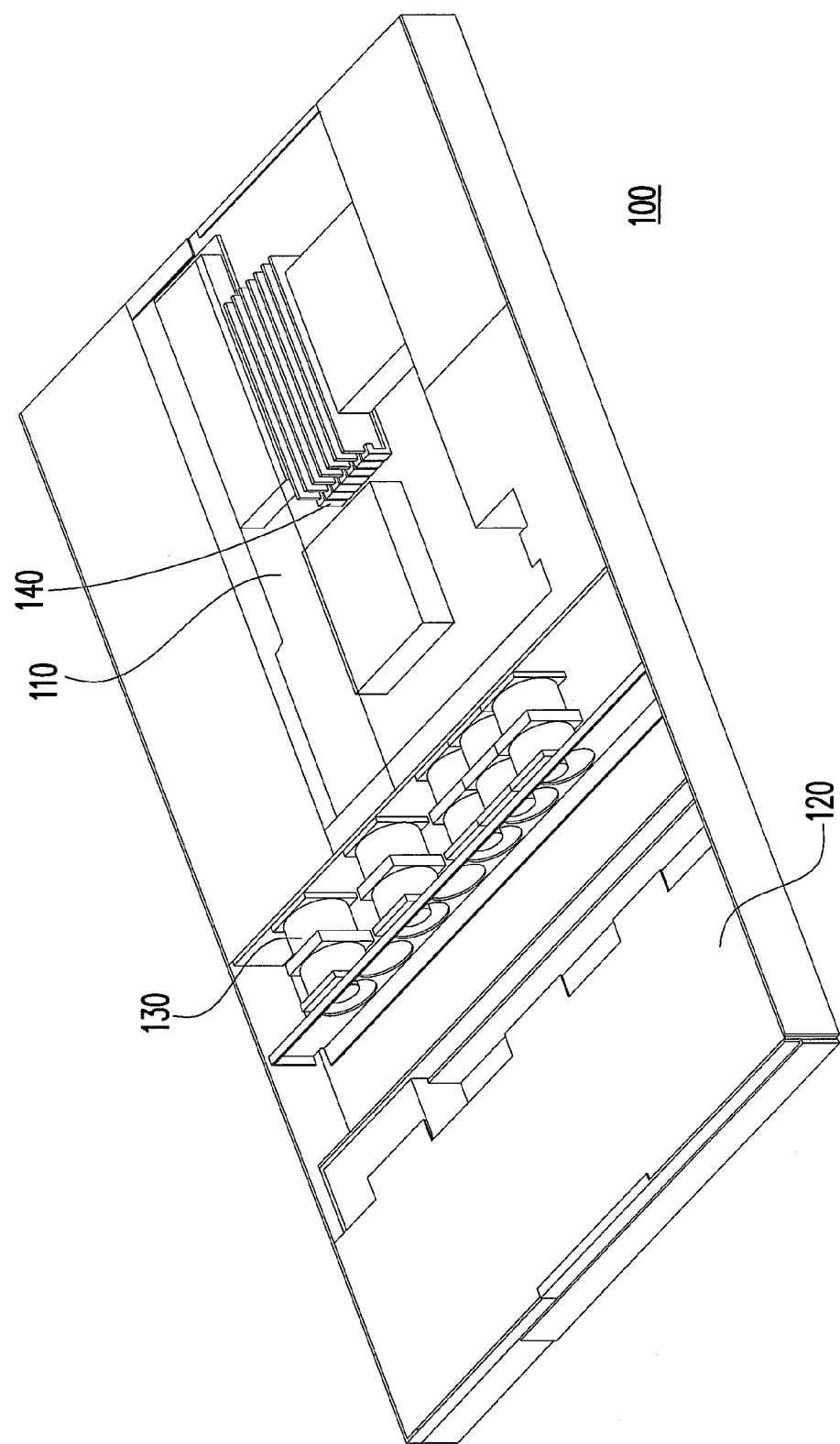
FIG. 1 illustrates the system architecture of a conventional server.
Figure 2:
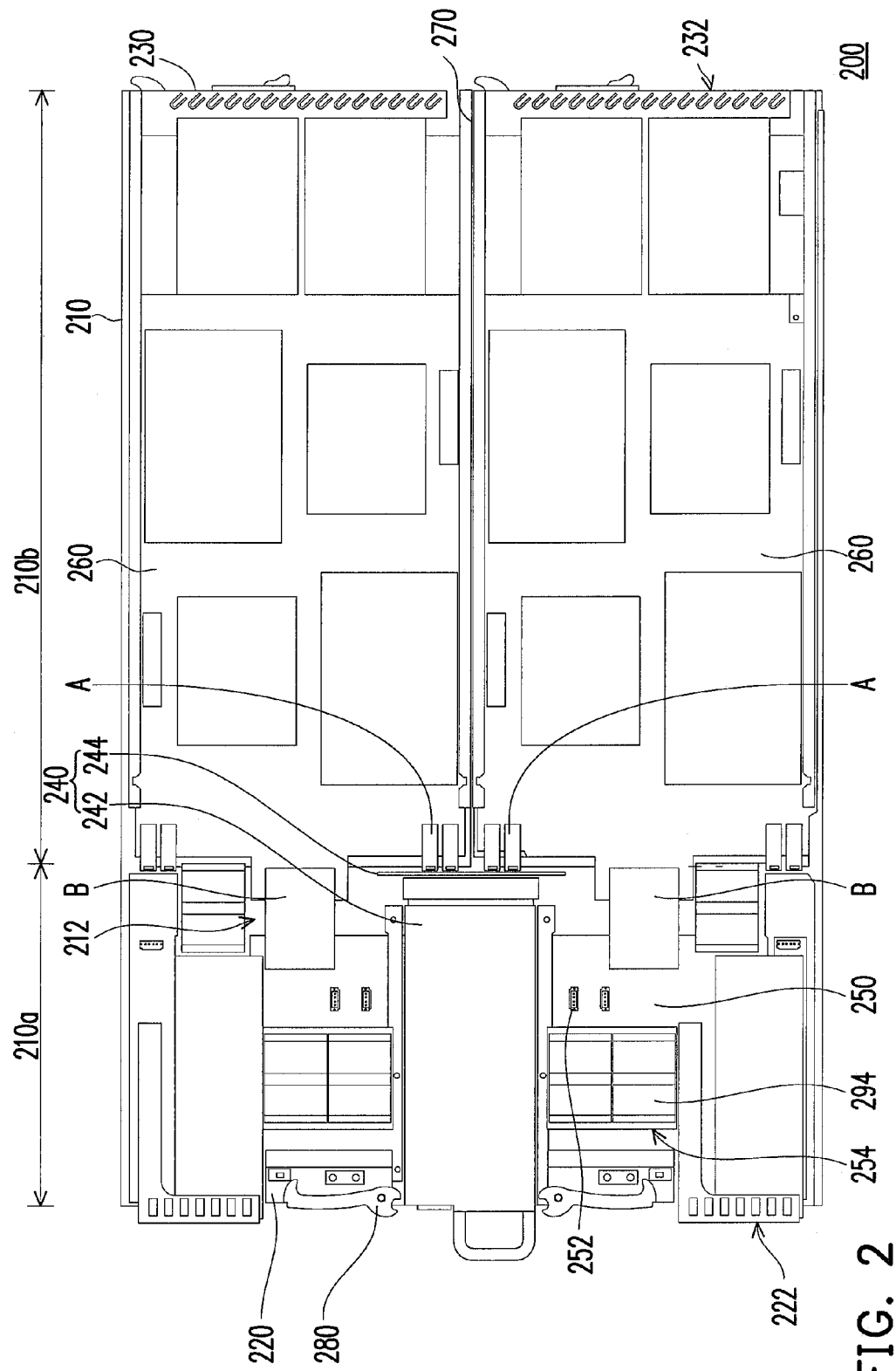
FIG. 2 illustrates a server according to one embodiment of the present invention.

FIG. 2 illustrates a server according to one embodiment of the present invention. Referring to FIG. 2, the server 200 includes a chassis 210, at least one first tray 220, at least one second tray 230, a power supply module 240, a plurality of input/output interface circuit boards 250, and a plurality of mother boards 260. The first tray 220 and the second tray 230 are both slidingly disposed in the chassis 210. The first tray 220 and the second tray 230 can be drawn out of the chassis 210 in their respective directions which are opposite to each other. The power supply module 240 is disposed on a bottom plate 212 of the chassis 210. The input/output interface circuit boards 250 are disposed on the first trays 220, respectively. The power supply module 240 is disposed between two of the input/output interface circuit boards 250. Each of the input/output interface circuit boards 250 includes a plurality of input/output interfaces 252. The mother boards 260 are disposed on the second trays 230, respectively. The input/output interface circuit boards 250 and the power supply module 240 are electrically connected to the mother boards 260 correspondingly.

In the present embodiment, the number of the input/output interface circuit boards 250 is two, the number of the mother boards 260 is also two, and the input/output interface circuit boards 250 are positioned corresponding to the mother boards 260. Specifically, each of the mother boards 260 can include a plurality of connectors A, and the power supply module 240 is connected to the mother boards 260 through the connectors A, thus enabling the power supply module 240 to provide power to the mother boards 260. In addition, each of the mother boards 260 can include a plurality of connectors B, and the input/output interface circuit boards 250 are connected to the mother boards 260 through the connectors B, thus enabling the mother boards 260 to transmit signals to the input/output interface circuit boards 250. Although the connectors A and connectors B are illustrated as being disposed on the mother boards 260 in the present embodiment, it is noted that locations of the connectors A and connectors B can be varied based on actual requirements and needs. For instance, the connectors A may alternatively be disposed on the power supply module 240, and the connectors B may alternatively be disposed on the input/output interface circuit boards 250, as long as the input/output interface circuit boards 250 and the power supply module 240 can be electrically connected to the mother boards 260.

The input/output interfaces 252 of the input/output interface circuit boards 250 can be universal serial buses (USB), peripheral component interconnect express (PCIE) cards or a network adapters, depending upon actual requirements and needs. In FIG. 2, the two input/output interface circuit boards 250 are symmetrically arranged about the power supply module 240. It is noted, however, that the arrangement of the components on the input/output interface circuit boards 250 of the server 200 can be varied based on actual requirements and needs.

Figure 3:
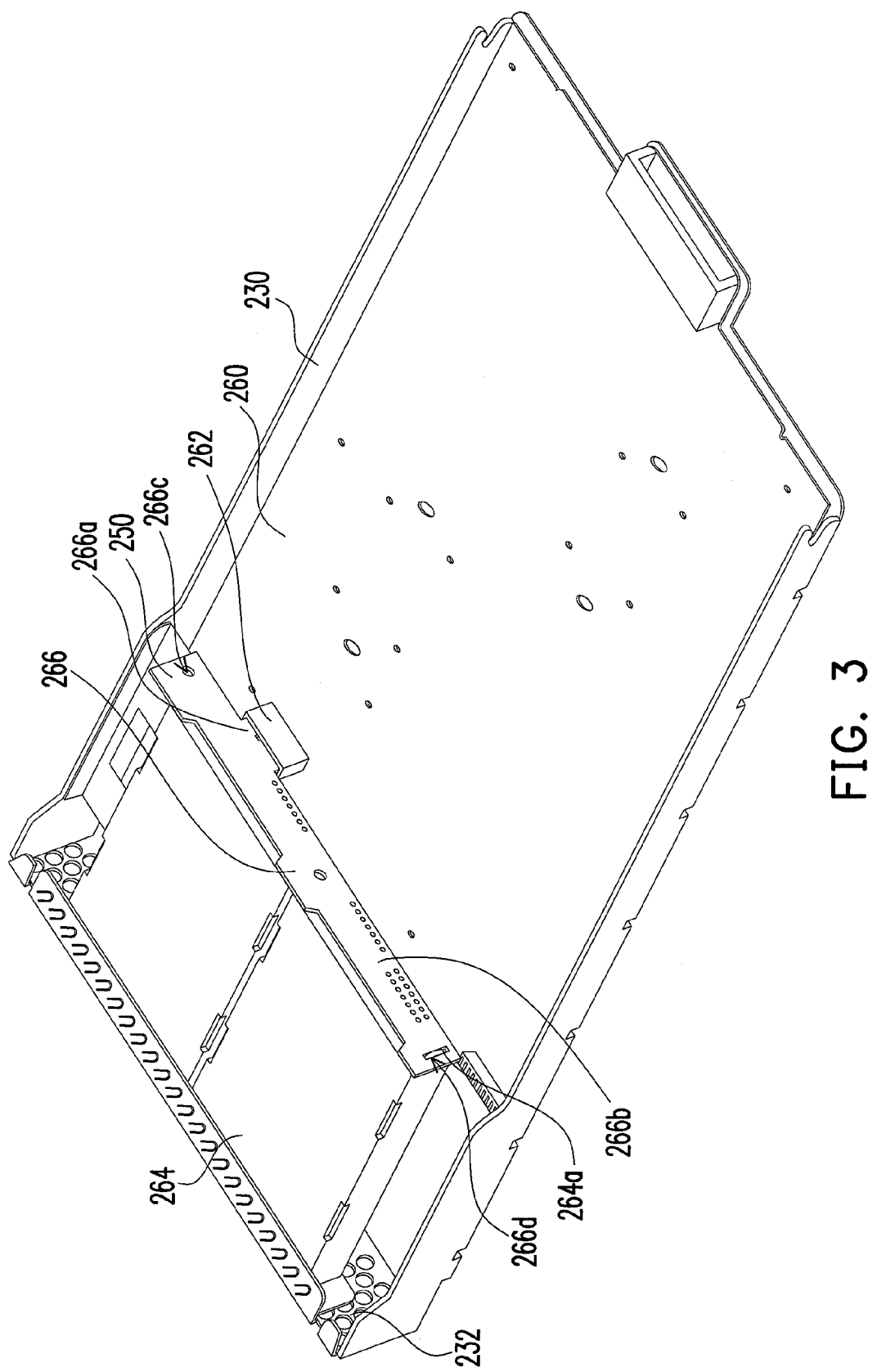
FIG. 3 illustrates a hard disk drive with a backplane plugged onto a mother board.

FIG. 3 illustrates a hard disk drive (HDD) with its backplane plugged onto the mother board. Referring to FIG. 3, the server 200 further includes a HDD bracket 264, a plurality of HDDs (not shown), and a HDD backplane 266. The HDD bracket 264 is disposed on the mother board 260. The mother board 260 has a slot 262. The HDD bracket 264 includes a plurality of fixing portions 264a and the fixing portions 264a are disposed on a side of the HDD bracket 264 that is adjacent the slot 262. The HDDs (not shown) are disposed on the HDD bracket 264. The HDD backplane 266 includes a first connecting portion 266a, a plurality of second connecting portions 266b, and a plurality of mounting portions 266c and 266d. The first connecting portion 266a is a gold finger interface connected to the slot 262. The second connecting portions 266b are connected to the HDDs (not shown), respectively. The mounting portions 266c, 266d are mounted to the fixing portions 264a so as to fix the HDD backplane 266 to one side of the HDD bracket.

As shown in FIG. 2, the power supply module 240 includes a power supply 242 and a power supply backplane 244. The power supply 242 is mounted on the bottom plate 212 of the chassis 210 and located between two of the input/output interface circuit boards 250. The power supply backplane 244 is disposed in the chassis 210 and between the mother boards 260 and the input/output interface circuit boards 250. The power supply backplane 244 is connected with the connectors A on the mother boards 260 such that the power supply module 240 is electrically connected to the mother boards 260. In addition, the power supply backplane 244 divides the chassis 210 into a first region 210a in which the first trays 220 are located and a second region 210b in which the second tray 230 are located.

In comparison with the conventional server, the first tray 220 and the second tray 230 can be drawn out of the chassis 210 in opposite directions so as to allow the users to conveniently repair and replace electronic components on the mother boards 260 and input/output interface circuit boards 250. In addition, this also allows locations of the power supply module 240, input/output interface circuit boards 250 and mother boards 260 to be re-arranged to meet customizing needs.

The sliding of the first tray 220 and the second tray 230 in the chassis 210 can be achieved by using rails (not shown) disposed in the chassis 210. The first tray 220 and the second tray 230 can be coupled to the rails, respectively, which allows the user to slide the first tray 220 and the second tray 230 and hence allows the input/output interface circuit boards 250 or mother boards 260 to be drawn out of the chassis 210 in opposite directions away from the power supply backplane 224, thus facilitating the repairing and replacing by the user. In addition, the server 200 may further include a central partition plate 270 also having rails. The second tray 230 is coupled to the rails of the chassis 210 and the rails of the central partition plate 270, such that the second tray 230 can be drawn out of the chassis 210 for replacing or repairing the electronic components on the mother board 260. With the provision of the central partition plate 270, the mother boards 260 can be isolated from each other. Likewise, the central partition plate 270 can also be disposed in the first region 210a, such that the first tray 220 is coupled to the rails of the chassis 210 and the rails of the central partition plate 270. As a result, the first tray 220 can be drawn out of the chassis 210 for facilitating replacing or repairing the electronic components on the input/output interface circuit board 250. In addition, the central partition plate 270 can also isolate the input/output interface circuit boards 250 from each other, or isolate the input/output interface circuit boards 250 from the power supply module 240.

With the side rail of the central partition plate 270, the power supply 242 may also be installed in a power supply cage (not shown) that is slidingly disposed between two central partition plates 270, for facilitating the users removing, replacing as well as repairing the power supply 242.

Figure 4:
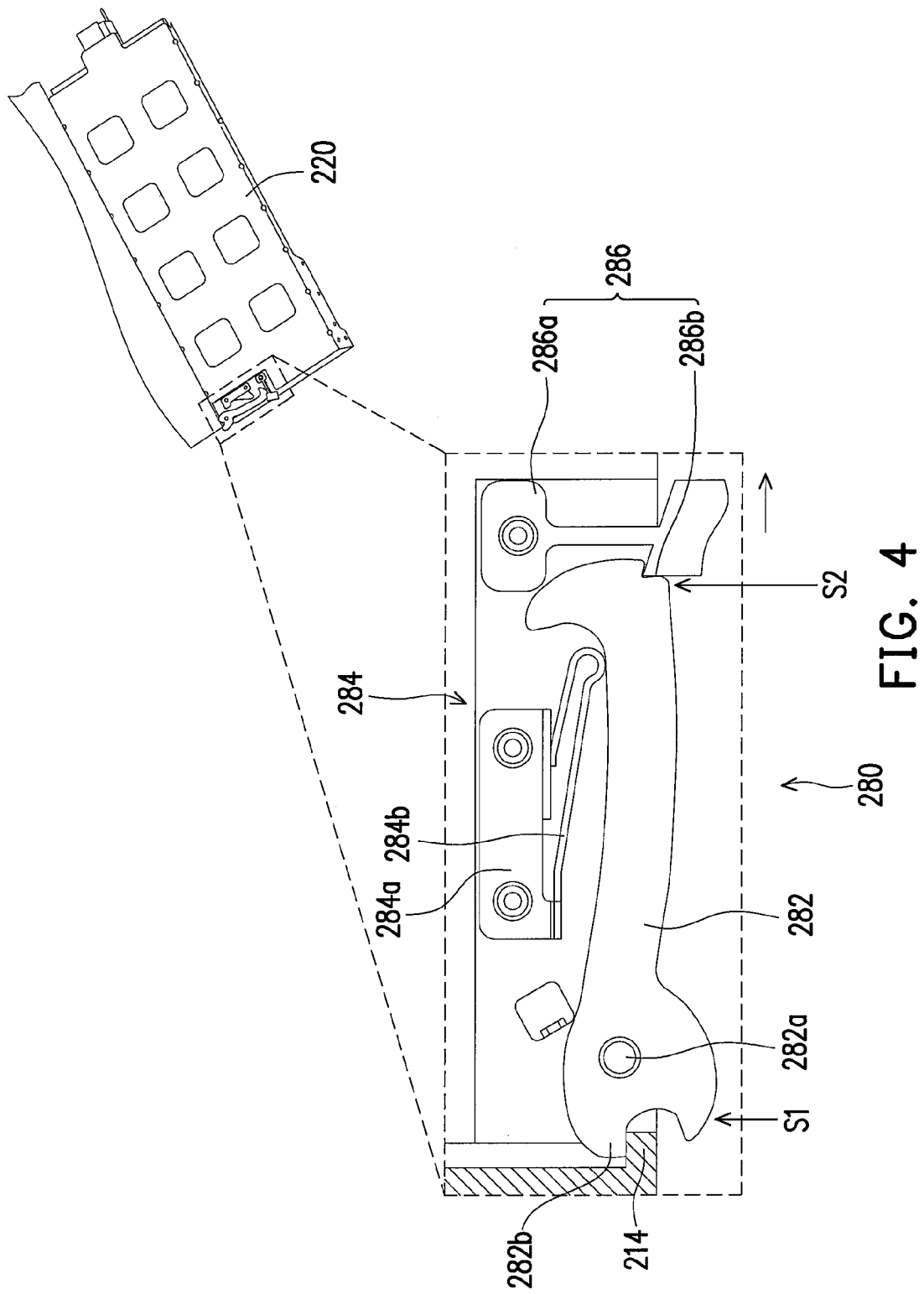
FIG. 4 illustrates a snap-fit structure mounted to a bottom of a first tray.

FIG. 4 illustrates snap-fit structures mounted to a bottom of the first tray. Referring to FIG. 4, the server 200 further includes a plurality of snap-fit structures 280. These snap-fit structures 280 are, for example, disposed on a surface of bottoms of the first tray 220 and the second tray 230 (in FIG. 4, the snap-fit structure is disposed on the bottom of the first tray 220) to secure the first tray 220 and the second tray 230 within the chassis 210. Preferably, these snap-fit structures 280 are disposed on a side of the first tray 220/second tray 230 that is away from the second tray 230/first tray 220. Specifically, the chassis 210 includes a positioning portion 214. The snap-fit structure 280 includes a handgrip 282, a spring element 284, and a locking element 286. The handgrip 282 includes a rotary axle 282a and a positioning element 282b and has a first end S1 and a second end S2 opposite to the first end S1. The rotary axle 282a is positioned at the first end S1 and adapted to be connected to the first tray 220 or the second tray 230 such that the handgrip 282 is adapted to rotate on the surface of the bottom of the first tray 220 or the second tray 230. The positioning element 282b is positioned at the first end and adapted to interfere with the positioning portion 214 such that the first tray 220 or the second tray 230 is disposed in the chassis 210. The spring element 284 includes a first fixing portion 284a and an urging portion 284b. The first fixing portion 284a is adapted to be fixed to the first tray 220. The urging portion 284b is connected to the first fixing portion 284a and urges against the handgrip 282. The locking element 286 includes a second positioning portion 286a and a locking portion 286b. The second positioning portion 286a is adapted to be connected to the first tray 220. The locking portion 286b is connected with the second positioning portion 286a and is adapted to be locked with the second end S2. When the locking element 286 is locked with the handgrip 282, the handgrip 282 is in an initial position. When the locking portion 286b and the handgrip 282 do not interface with each other, the elasticity of the urging portion 284b acts on the handgrip 282 to urge against the handgrip 282 away from its initial position. When the handgrip 282 leaving its initial position urges the urging portion 284b such that the locking portion 286b is locked with the handgrip 282, the handgrip 282 is positioned in its initial position.

Figure 5:
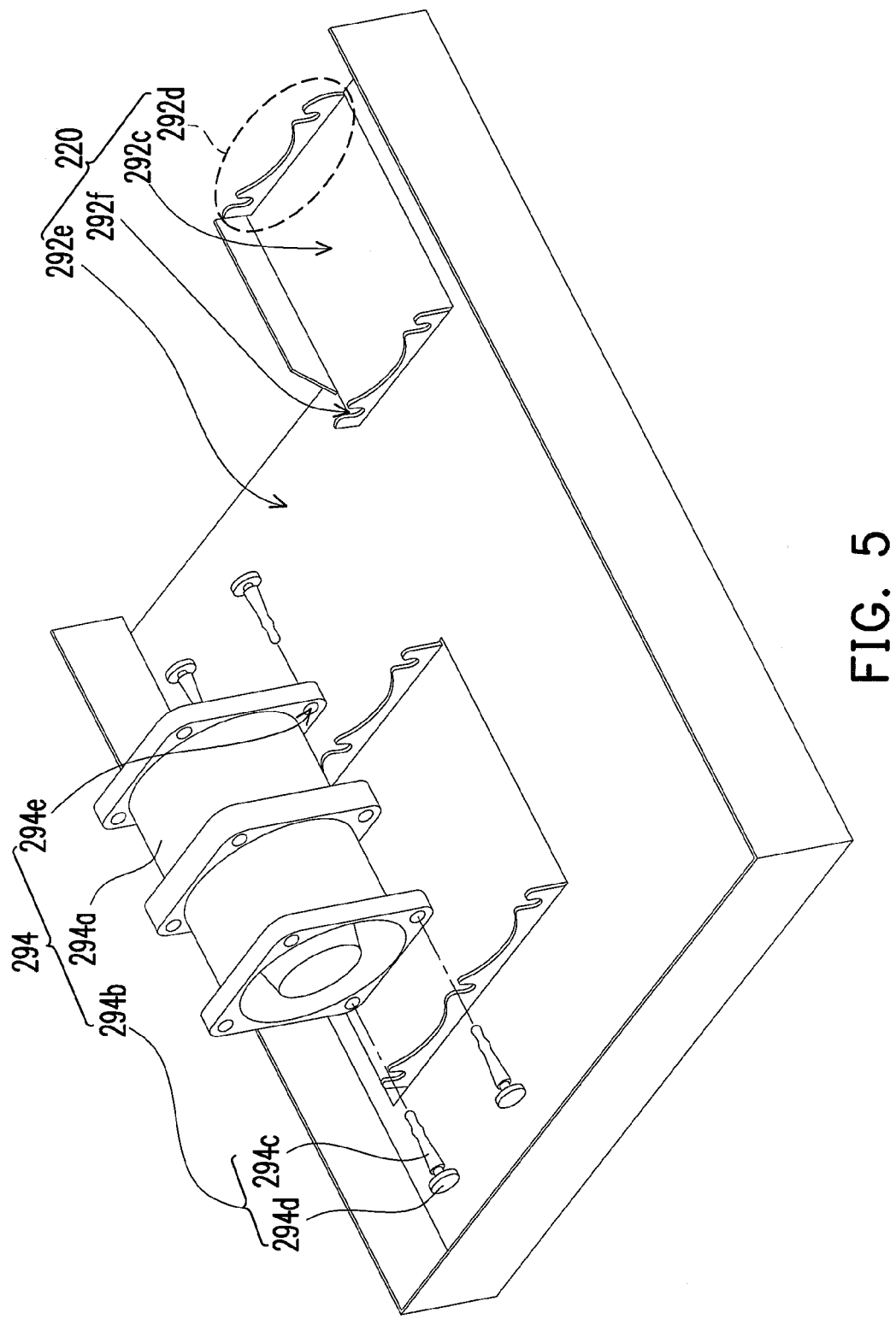
FIG. 5 illustrates a fan module mounted in the server.

FIG. 5 illustrates a fan module mounted in the server. Referring to FIG. 5, the server 200 further includes a plurality of fan units 294 disposed on the first tray 220. The number of the fan units 294 can be determined based on actual requirements. Each of the input/output interface circuit boards 250 which disposed on the first tray 220 has an opening 254 according to the position for the fan unit 294. The first tray 220 has a plurality of receiving slots 292c and a plurality of opposing supporting portions 292d. The first tray 220 has a top surface 292e. These supporting portions 292d are formed by bending part of the first tray 220 toward the top surface 292e. That is, these supporting portions 292d are integrally formed with the first tray 220 and each has a plurality of latching slots 292f. The latching slots 292f are, for example, hardy holes. The supporting portions 292d are located at opposite sides of the receiving slots 292c, respectively. Each latching slot 292f is formed in a side of a corresponding one of the supporting portions 292d away from the top surface 292e. Each receiving slot 292c is sized to fit one or two fan units 294 such that the fan units 294 can be disposed in the receiving slots 292c.

Each of the fan units 294 disposed on the first tray 220 includes a fan cage 294a and a plurality of fan vibration resisting elements 294b (only four vibration resisting elements are illustrated in FIG. 5) connected to the fan cage 294a. Each fan unit 294 includes a fan motor (not shown) and a fan blade that are positioned in the fan cage 294a and looks like a cuboid. The fan vibration resisting elements 294b are secured to a bottom wall of the fan bracket 294a and are respectively latched in the latching slots 292f such that each fan bracket 294a suspends and is connected between corresponding opposing supporting portions 292d. In the present embodiment, each of the fan vibration resisting elements 294b includes a shaft body 294c and a flange 294d protruding from the shaft body 294c and looks like a bolt. The shaft body 294c and the flange 294d can be integrally formed. The material of the fan vibration resisting elements 294b is, for example, rubber or silica gel. In addition, four through holes 294e are defined through the four corners of the bottom wall of the fan cages 294a. Pairs of the through holes 294e correspond to the latching slots 292f of the supporting portions 292d. It should be noted that, in the present embodiment, these fan vibration resisting elements 294b are adapted to absorb vibrations caused by the fan units 294 themselves to avoid noises generated as a result of the vibrations.

As shown in FIGS. 2 and 3, a side of the first tray 220 away from the second tray 230 includes a first bending portion 222, and a side of the second tray 230 away from the first tray 220 includes a second bending portion 232. The first bending portion 222 and the second bending portion 232 form a rear window and a front window, respectively. The front window and the rear window are configured to prevent foreign matters from entering the chassis 210 of the server 200.

In summary, in the server of the present invention, the locations of the power supply backplane, the power supply module, the input/output interface circuit boards and the mother boards can be re-arranged to meet the customizing needs as well as use the space within the chassis more effectively. In addition, the provision of the rails and trays facilitates the user drawing the trays to remove the input/output interface circuit boards or mother boards from the chassis for repairing or replacing the electronic components on the input/output interface circuit boards or mother boards.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server comprising:
   a chassis;
   at least one first tray slidingly disposed in the chassis;
   at least one second tray slidingly disposed in the chassis such that the first trays and the second trays are capable of being drawn out of the chassis in opposite directions, respectively;
   a power supply module disposed on a bottom plate of the chassis;
   a plurality of input/output interface circuit boards disposed on the first trays, respectively, each of the input/output interface circuit boards comprising a plurality of input/output interfaces; and
   a plurality of mother boards disposed on the second trays, respectively, the input/output interface circuit boards and the power supply module being electrically connected to the mother boards correspondingly.

2. The server according to claim 1, wherein the power supply module comprises:
   a power supply fixed on the bottom plate of the chassis and disposed between two of the input/output interface circuit boards; and
   a power supply backplane disposed in the chassis and between the mother boards and the input/output interface circuit boards, the power supply backplane being electrically connected with the mother boards.

3. The server according to claim 2, wherein the power supply backplane divides the chassis into a first region in which the first trays are disposed and a second region in which the second trays are disposed.

4. The server according to claim 1, wherein the mother boards comprise a plurality of connectors thereon, and the power supply module is connected to the mother boards through the connectors such that the power supply module supplies power to the mother boards.

5. The server according to claim 4, wherein the input/output interface circuit boards comprise a plurality of connectors thereon, and the connectors on the mother boards are coupled to the connectors on the input/output interface circuit boards such that the mother boards transmit signals to the input/output interface circuit boards.

6. The server according to claim 4, further comprising:
   a hard disk drive bracket disposed on the mother board, the mother board having a slot, the hard disk drive bracket comprising a plurality of fixing portions disposed on a side of the hard disk drive bracket adjacent the slot;
   a plurality of hard disk drives disposed in the hard disk drive bracket; and
   a hard disk drive backplane comprising:
      a first connecting portion being a gold finger interface connected into the slot;
      a plurality of second connecting portions corresponding to the hard disk drives, each of the hard disk drives connected to a corresponding one of the second connecting portions; and
      a plurality of mounting portions mounted to the fixing portions to fix the hard disk drive backplane to one side of the hard disk drive bracket.

7. The server according to claim 1, further comprising at least one fan unit disposed on the first tray, each of the input/output interface circuit boards which disposed on the first tray has an opening according to the position for the fan unit, and the first tray comprises a plurality of opposing supporting portions, each of the supporting portions has a plurality of latching slots, each of the fan units comprises a fan bracket and a plurality of fan vibration resisting elements connected to the fan bracket, the fan vibration resisting elements are fixed to a bottom side wall of the fan bracket and are correspondingly latched in the latching slots, respectively, such that each of the fan brackets suspends and is fixed between any two of the opposing supporting portions.

8. The server according to claim 1, wherein the input/output interface can be a universal serial bus interface, a peripheral component interconnection express card or a network adapter.

9. The server according to claim 1, further comprising a plurality of snap-fit structures adapted to be disposed on a surface of the first tray and the second tray, each of the snap-fit structures disposed at a side of one of the first tray and the second tray away from each other, the chassis comprising a positioning portion, each snap-fit structure comprising:
   a handgrip pivoted on the surface of the first tray or the second tray;
   a spring element, connected to and fixed at the first tray or the second tray and urged against the handgrip; and
   a locking element fixed to the first tray or the second tray such that the handgrip is in an initial position when the locking element is locked with the handgrip,
   wherein when the locking element does not interfere with the handgrip, the elasticity of the spring element is exerted on the handgrip to move the handgrip away from its initial position,
   and the handgrip leaving its initial position urges the spring element such that the locking element is hooked with the handgrip, the handgrip is positioned in its initial position.

10. The server according to claim 9, wherein the handgrip comprises a rotary axle and a positioning element, the handgrip has a first end and a second end opposite to the first end, the rotary axle is disposed at the first end and adapted to be connected to the first tray or the second tray such that the handgrip is adapted to rotate on the surface, and the positioning element is disposed on the first end and adapted to interfere with the positioning portion such that the first tray or the second tray is fixed to the chassis.

11. The server according to claim 10, wherein the locking element comprises a second fixing portion and a locking portion, the second fixing portion adapted to be fixed to the first tray or the second tray, and the locking portion connected to the second fixing portion and locked to the second end.

12. The server according to claim 9, wherein the spring element comprises a first fixing portion and an urging portion, the first fixing portion is adapted to be fixed to the first tray or the second tray, and the urging portion connected to the first fixing portion and urging the handgrip.

13. The server according to claim 1, further comprising a plurality of central partition plates adapted to isolate the mother boards or the input/output interface circuit boards from each other, each of the central partition plates comprising a plurality of rails through which the first trays and the second trays are slidingly disposed in the chassis.

14. The server according to claim 1, wherein the side of the first tray away from the second tray comprises a first bending portion, the side of the second tray away from the first tray comprises a second bending portion, and the first bending portion and the second bending portion form a rear window and a front window of the chassis, respectively.

* * * * *